United States Patent
Sato et al.

(10) Patent No.: US 11,499,876 B2
(45) Date of Patent: Nov. 15, 2022

(54) STRAIN GAUGE AND SENSOR MODULE

(71) Applicant: MINEBEA MITSUMI Inc., Nagano (JP)

(72) Inventors: Satoshi Sato, Kanagawa (JP); Shigeyuki Adachi, Shizuoka (JP); Eiji Misaizu, Kanagawa (JP); Atsushi Kitamura, Shizuoka (JP); Toshiaki Asakawa, Shizuoka (JP); Hirotsugu Iijima, Tokyo (JP); Yoichi Kimura, Kanagawa (JP)

(73) Assignee: MINEBEA MITSUMI Inc., Nagano (JP)

( * ) Notice: Subject to any disclaimer, the term of this patent is extended or adjusted under 35 U.S.C. 154(b) by 187 days.

(21) Appl. No.: 16/757,869

(22) PCT Filed: Oct. 25, 2018

(86) PCT No.: PCT/JP2018/039716
§ 371 (c)(1),
(2) Date: May 18, 2020

(87) PCT Pub. No.: WO2019/082978
PCT Pub. Date: May 2, 2019

(65) Prior Publication Data
US 2021/0063258 A1  Mar. 4, 2021

(30) Foreign Application Priority Data
Oct. 27, 2017 (JP) .............................. JP2017-208195

(51) Int. Cl.
*G01L 1/22* (2006.01)
*G01L 5/00* (2006.01)
(Continued)

(52) U.S. Cl.
CPC ............ G01L 1/225 (2013.01); G01L 5/0028 (2013.01); H01C 7/003 (2013.01); H05K 1/167 (2013.01);
(Continued)

(58) Field of Classification Search
CPC ....... G01L 1/225; G01L 5/0028; H01C 7/003; H05K 1/0393; H05K 1/167;
(Continued)

(56) References Cited

U.S. PATENT DOCUMENTS 4,432,247 A * 2/1984 Takeno ................. G01L 1/2287
73/776
4,677,413 A * 6/1987 Zandman ................. H01C 7/06
338/195

(Continued)

FOREIGN PATENT DOCUMENTS

EP  0171467  2/1986
EP  725392   8/1996
(Continued)

OTHER PUBLICATIONS

English Translation JP06307950, Published Nov. 4, 1994 (Year: 1994).*

(Continued)

*Primary Examiner* — Steven T Sawyer
(74) *Attorney, Agent, or Firm* — IPUSA, PLLC

(57) ABSTRACT

The present strain gauge includes a substrate having flexibility; a resistor formed from a material containing at least one of chromium and nickel, on the substrate; a pair of wiring patterns formed on the substrate and electrically connected to both ends of the resistor; and a pair of electrodes formed on the substrate and electrically connected to the pair of wiring patterns, respectively. The wiring patterns include a first layer extending from the resistor, and a second
(Continued)

layer having a lower resistance than the first layer and layered on the first layer. On the substrate, an electronic component mounting area is demarcated, on which an electronic component electrically connected to the electrodes is mounted.

11 Claims, 9 Drawing Sheets

(51) Int. Cl.
    *H01C 7/00*         (2006.01)
    *H05K 1/16*         (2006.01)
    *H05K 1/02*         (2006.01)
    *H05K 1/03*         (2006.01)

(52) U.S. Cl.
    CPC ........... *H05K 1/028* (2013.01); *H05K 1/0298* (2013.01); *H05K 1/032* (2013.01); *H05K 1/0393* (2013.01); *H05K 2201/10151* (2013.01)

(58) Field of Classification Search
    CPC ......... H05K 2201/10151; H05K 1/028; H05K 1/0298; H05K 1/032; G01B 7/20
    See application file for complete search history.

(56) References Cited

U.S. PATENT DOCUMENTS

| | | | | |
|---|---|---|---|---|
| 4,747,456 | A * | 5/1988 | Kitagawa | G01L 1/2281 338/3 |
| 4,758,816 | A * | 7/1988 | Blessing | G01B 7/20 338/2 |
| 5,079,535 | A * | 1/1992 | Neuman | A61B 5/1135 73/862.627 |
| 5,328,551 | A * | 7/1994 | Kovacich | H01C 10/10 216/48 |
| 5,914,168 | A | 6/1999 | Wakamatsu et al. | |
| 2004/0124018 | A1 | 7/2004 | Yanagi | |
| 2004/0140868 | A1 | 7/2004 | Takeuchi et al. | |
| 2005/0155435 | A1* | 7/2005 | Ziebart | G01G 3/1412 73/781 |
| 2005/0163461 | A1* | 7/2005 | Ziebart | G01G 3/1402 385/147 |
| 2005/0188769 | A1 | 9/2005 | Moelkner et al. | |
| 2005/0276990 | A1 | 12/2005 | Kohara et al. | |
| 2012/0247220 | A1* | 10/2012 | Inamori | G01L 1/2281 73/766 |
| 2018/0217016 | A1 | 8/2018 | Inamori et al. | |

FOREIGN PATENT DOCUMENTS

| | | |
|---|---|---|
| JP | S58-118930 | 7/1983 |
| JP | S61-176803 | 8/1986 |
| JP | H06-300649 | 10/1994 |
| JP | H06-307950 | 11/1994 |
| JP | H07-306002 | 11/1995 |
| JP | H08-102163 | 4/1996 |
| JP | H09-016941 | 1/1997 |
| JP | H10-270201 | 10/1998 |
| JP | 2001-338382 | 12/2001 |
| JP | 2004-072715 | 3/2004 |
| JP | 2004-205410 | 7/2004 |
| JP | 2007-173544 | 7/2007 |
| JP | 2015-031633 | 2/2015 |
| JP | 2016-074934 | 5/2016 |
| JP | 2016-136605 | 7/2016 |
| JP | 2017-067764 | 4/2017 |
| JP | 2017-101983 | 6/2017 |

OTHER PUBLICATIONS

English Translation EP0171467) Published Feb. 19, 1986 (Year: 1986).*
Office Action dated Dec. 7, 2021 with respect to the corresponding Japanese patent application No. 2017-208195.
Office Action dated Jan. 13, 2022 with respect to the corresponding Chinese patent application No. 201880083538.X.
International Search Report for PCT/JP2018/039716 dated Jan. 15, 2019.
Office Action dated Jun. 2, 2021 with respect to the corresponding Chinese Patent Application No. 201880083538.X.
Extended European Search Report dated Jun. 22, 2021 with respect to the corresponding European Patent Application No. 18871642.7.
Office Action dated Sep. 6, 2022 with respect to the related Japanese patent application No. 2017-208195.
C. Rebholz et al., "Structure, mechanical and tribological properties of nitrogen-containing chromium coatings prepared by reactive magnetron sputtering", Surface and Coatings Technology, vol. 115, Issues 2-3, pp. 222-229, Jul. 18, 1999.
Haruhiro Kobayashi, Nikkan Kogyo Shimbun, Ltd., "Sputter thin film—Fundamentals and Applications", 1st Edition, 1st Printing, p. 102-107, Feb. 25, 1993 (With Partial Translation).
Kyoritsu Shuppan Co., Ltd., "Dictionary of Crystal Growth", 1st Edition, 1st Printing, p. 50-51, Jul. 25, 2001 (With Partial Translation).

* cited by examiner

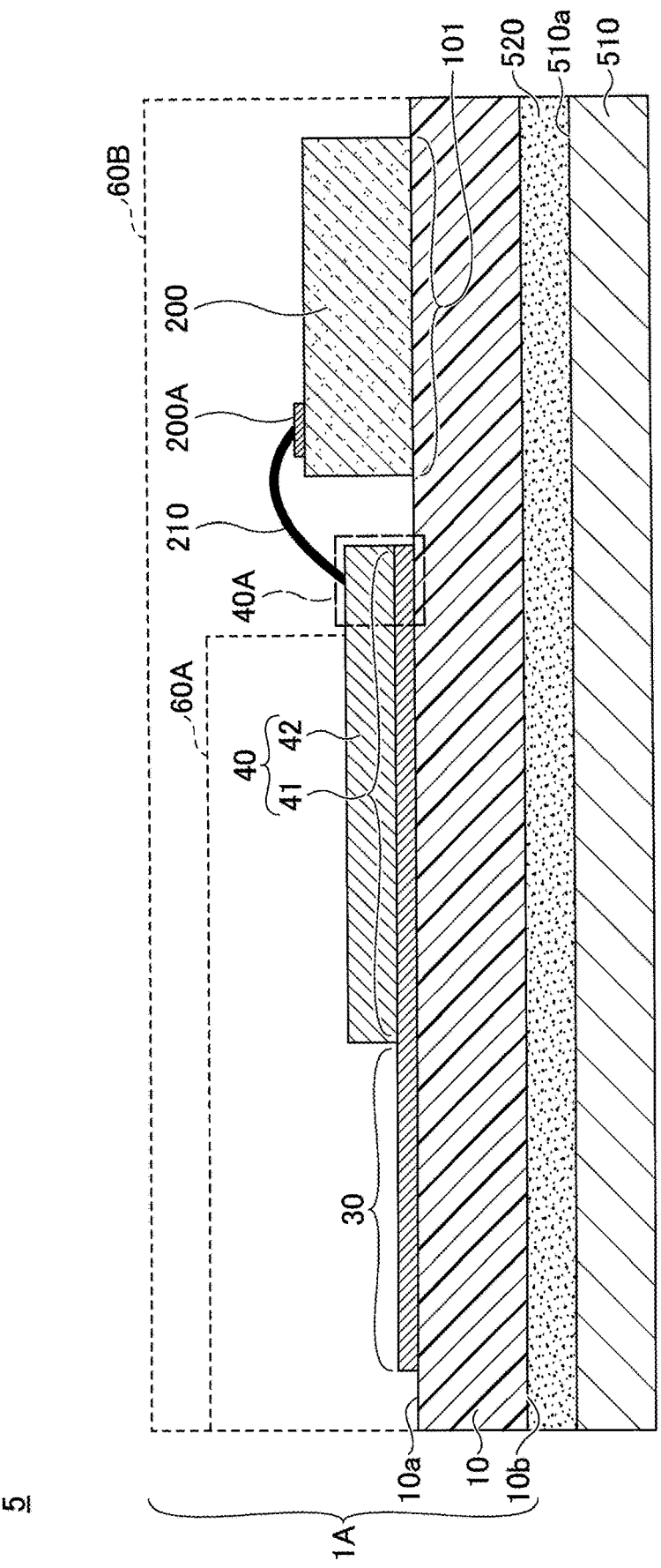

STRAIN GAUGE AND SENSOR MODULE

TECHNICAL FIELD

The present invention relates to a strain gauge and a sensor module.

BACKGROUND ART

Strain gauges that have been known are attached to an object to be measured so as to detect a strain of the object. Such a strain gauge includes a resistor for detecting a strain, and as materials of the resistor, materials containing, for example, Cr (chromium) and/or Ni (nickel) are used. Also, for example, both ends of the resistor are used as electrodes, and a lead wire or the like for external connection is joined to each electrode by solder, so that a signal can be input and output to and from an electronic component (see, e.g., Patent Document 1).

RELATED-ART DOCUMENTS

Patent Documents

[Patent Document 1] Japanese Unexamined Patent Application Publication No. 2016-74934

SUMMARY OF THE INVENTION

Problem to be Solved by the Invention

However, using lead wires for electrical connection between electrodes and an electronic component has a problem that the entire device becomes larger.

The present invention has been made in view of the above point, and has an object to make a strain gauge smaller.

Means for Solving the Problem

The present strain gauge includes a substrate having flexibility; a resistor formed from a material containing at least one of chromium and nickel, on the substrate; a pair of wiring patterns formed on the substrate and electrically connected to both ends of the resistor; and a pair of electrodes formed on the substrate and electrically connected to the pair of wiring patterns, respectively. The wiring patterns include a first layer extending from the resistor, and a second layer having a lower resistance than the first layer and layered on the first layer. On the substrate, an electronic component mounting area is demarcated, on which an electronic component electrically connected to the electrodes is mounted.

Advantage of the Invention

According to the disclosed technique, it is possible to make a strain gauge smaller.

BRIEF DESCRIPTION OF THE DRAWINGS

FIG. 9 is a cross-sectional view illustrating a sensor module according to the second embodiment.

DETAILED DESCRIPTION OF THE PREFERRED EMBODIMENTS

Figure 1:
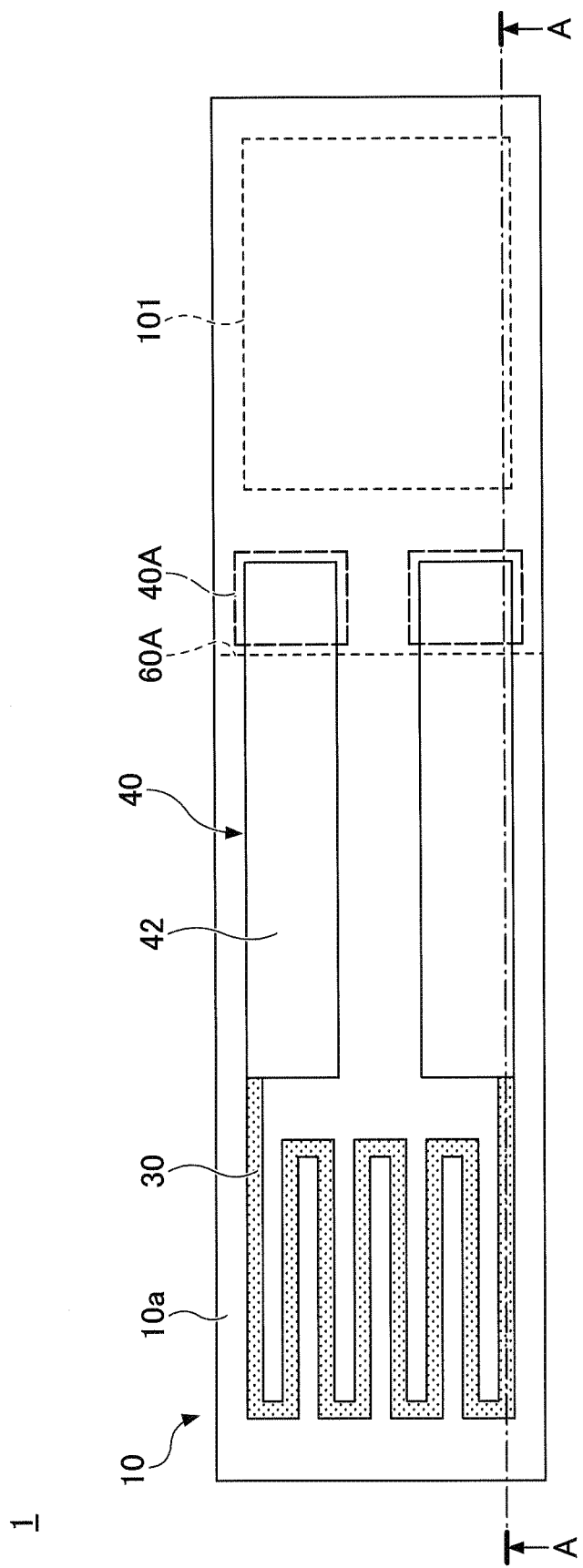
FIG. 1 is a plan view illustrating a strain gauge according to a first embodiment.

In the following, embodiments for carrying out the present invention will be described with reference to the drawings. Throughout the drawings, the same elements are assigned the same reference numerals, and duplicate description may be omitted.

First Embodiment

Figure 2:
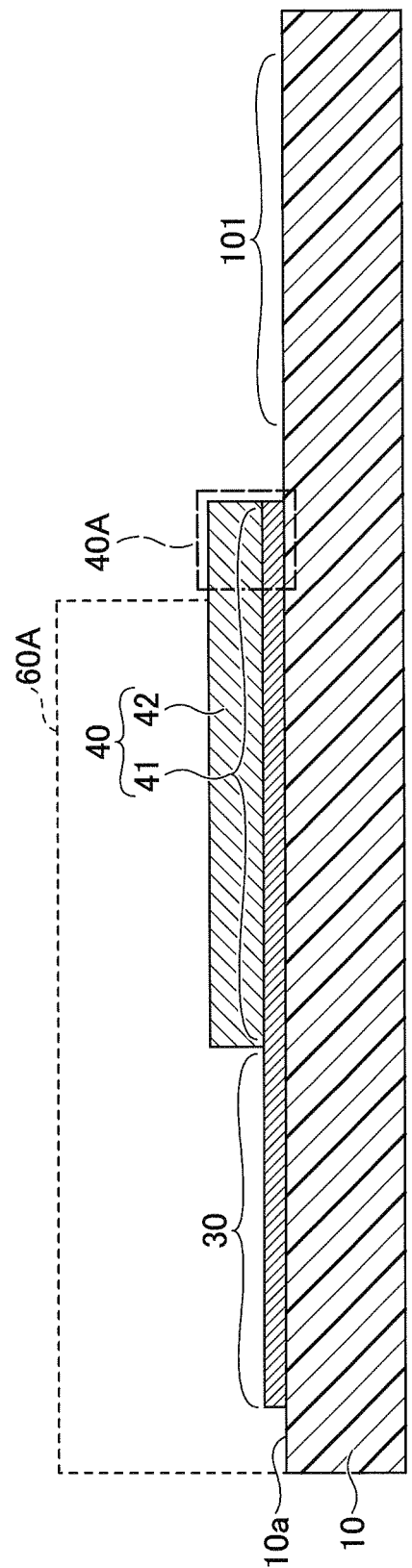
FIG. 2 is a first cross-sectional view illustrating a strain gauge according to the first embodiment.

FIG. 1 is a plan view illustrating a strain gauge according to a first embodiment. FIG. 2 is a cross-sectional view illustrating a strain gauge according to the first embodiment, which illustrates a cross section taken along a line AA in FIG. 1. Referring to FIGS. 1 and 2, a strain gauge 1 includes a substrate 10, a resistor 30, wiring patterns 40, and electrodes 40A.

Note that in the present embodiment, for the sake of convenience, a side of the strain gauge 1 on which the resistor 30 of the substrate 10 is provided is defined as an upper side or one side, and another side on which the resistor 30 is not provided is defined as a lower side or the other side. Also, a surface of each part on which the resistor 30 is provided is defined as one surface or upper surface, and another surface on which the resistor 30 is not provided is defined as the other surface or lower surface. However, the strain gauge 1 can be used upside down, or can be arranged at any angle. Also, a plan view refers to viewing an object from the normal direction of the upper surface 10a of the substrate 10, and a planar shape refers to a shape of an object viewed from the normal direction of the upper surface 10a of the substrate 10.

The substrate 10 is a member serving as a base layer for forming the resistor 30 and the like, and has flexibility. The thickness of the substrate 10 is not limited in particular and can be selected appropriately depending on the purpose; for example, the thickness can be approximately 5 µm to 500 µm. Especially, it is favorable that the thickness of the substrate 10 is between 5 am and 200 µm from the viewpoint of the transmission of strain from the surface of the strain generator joined to the lower surface of the substrate 10 via an adhesive layer or the like, and the dimensional stability with respect to the environment; and it is more favorable that the thickness is greater than or equal to 10 µm from the viewpoint of insulation.

The substrate 10 can be formed from an insulating resin film, for example, PI (polyimide) resin, epoxy resin, PEEK (polyether ether ketone) resin, PEN (polyethylene naphthalate) resin, PET (polyethylene terephthalate) resin, PPS (polyphenylene sulfide) resin, polyolefin resin, or the like.

Note that a film refers to a member having a thickness of approximately less than or equal to 500 μm and having flexibility.

Here, "formed from an insulating resin film" does not preclude a substrate 10 from containing fillers, impurities, and the like in the insulating resin film. The substrate 10 may be formed from, for example, an insulating resin film containing a filler such as silica or alumina.

On the upper surface 10a of the substrate 10, an electronic component mounting area 101 is demarcated, on which an electronic component electrically connected to the electrodes 40A is mounted. Electronic components that can be mounted on the electronic component mounting area 101 include an active component such as a semiconductor chip and a passive component such as a capacitor. In the electronic component mounting area 101, a wiring pattern electrically connected to the electronic component may be formed.

The resistor 30 is a thin film formed on the substrate 10 to have a predetermined pattern, which is a sensing part in which a resistance change is generated in response to a strain. The resistor 30 may be formed directly on the upper surface 10a of the substrate 10, or may be formed on the upper surface 10a of the substrate 10 via another layer. Note that in FIG. 1, the resistor 30 is illustrated in a dot pattern for the sake of convenience.

The resistor 30 can be formed from, for example, a material containing Cr (chromium), a material containing Ni (nickel), or a material containing both Cr and Ni. In other words, the resistor 30 can be formed from a material containing at least one of Cr and Ni. As an example of the material containing Cr, for example, a Cr composite film may be cited. As an example of the material containing Ni, for example, Cu—Ni (copper-nickel) may be cited. As a material containing both Cr and Ni, for example, Ni—Cr (nickel-chrome) may be cited.

Here, the Cr composite film is a film in which Cr, CrN, $Cr_2N$, and the like are mixed. The Cr composite film may contain unavoidable impurities such as chromium oxide.

The thickness of the resistor 30 is not limited in particular and can be selected appropriately depending on the purpose; for example, the thickness can be approximately 0.05 μm to 2 μm. Especially, it is favorable that the thickness of the resistor 30 is greater than or equal to 0.1 μm because the crystallinity of crystals constituting the resistor 30 (e.g., the crystallinity of α-Cr) improves, and it is further favorable that the thickness is less than or equal to 1 μm because cracks in the film and/or the warp from the substrate 10 due to the internal stress of the film constituting the resistor 30 can be reduced.

For example, in the case of the resistor 30 being a Cr composite film, the stability of the gauge characteristics can be improved by using α-Cr (alpha chromium), which is a stable crystal phase, as the main component. Also, by having the resistor 30 mainly constituted with α-Cr, the gauge factor of the strain gauge 1 can be greater than or equal to 10, and the temperature coefficient of gauge factor TCS and the temperature coefficient of resistance TCR can be fallen within a range of −1000 ppm/° C. to +1000 ppm/° C. Here, the main component means that a substance accounts for greater than or equal to 50 mass % among all substances constituting the resistor; from the viewpoint of improving the gauge characteristics, it is favorable that the resistor 30 contains α-Cr by greater than or equal to 80 wt %. Note that α-Cr is Cr having a bcc structure (body-centered cubic lattice structure).

The wiring patterns 40 are a pair of wiring patterns electrically connected to both ends of the resistor 30. The wiring patterns 40 include a first layer 41, and a second layer 42 layered on the first layer 41. The first layer 41 extends from both ends of the resistor 30, and is formed in a substantially rectangular shape having a wider width than the resistor 30 in plan view. The second layer 42 is layered on the upper surface of the first layer 41. The resistor 30 extends, for example, in a zigzag way from one of the wiring patterns 40 and is connected to the other of the wiring patterns 40. The wiring pattern 40 is not limited to a linear shape, and may have any pattern. Also, the wiring pattern 40 can have any width and any length.

Each electrode 40A is electrically connected to a corresponding wiring pattern 40. The electrodes 40A are a pair of electrodes for outputting a change in the resistance value of the resistor 30 caused by a strain, and can be electrically connected to an electronic component mounted on the electronic component mounting area 101. The electrode 40A may be formed to have a width different from that of the wiring pattern 40.

Note that although different numerals are used for the resistor 30 and the first layer 41 for the sake of convenience, these may be integrally formed of the same material in the same process.

The second layer 42 has a lower resistance than the first layer 41. The material of the second layer 42 is not limited in particular and may be appropriately selected depending on the purpose as long as the material has a lower resistance than the first layer 41; for example, Cu, a Cu alloy, Ni, or a Ni alloy may be used. The thickness of the second layer 42 may be, for example, approximately 0.5 μm to 30 μm.

The second layer 42 may be a layered film. As the layered film, Cu/Ni/Au, Cu/NiP/Au, Cu/Pd/Au, Cu/Pt/Au, Ni/Au, NiP/Au, and the like may be listed. Note that "AA/BB" means a layered film in which an AA layer and a BB layer are layered in this order on the upper surface of an underlying layer (the same applies to a case of three layers or more). In these layered films, a Cu alloy may be used instead of Cu, and a Ni alloy may be used instead of Ni.

Note that although different numerals are used for the wiring pattern 40 and the electrode 40A for the sake of convenience, these may be integrally formed of the same material in the same process. However, the layer configuration of the electrode 40A may be different from the layer configuration of the wiring pattern 40. For example, Au or the like may be formed only on the uppermost layer of the electrode 40A to improve the connection reliability.

In this way, by selecting the material of the second layer 42, it is possible to improve the connection reliability with an electronic component without depending on the material of the first layer 41 which is the same material as the resistor 30.

Note that external input/output terminals can be provided at any positions on the upper surface 10a of the substrate 10, which can be electrically connected to an electronic component mounted on the electronic component mounting area 101, and allows signals inputting and outputting to and from an external circuit electrically connected to the strain gauge 1.

A cover layer 60A (a first insulating resin layer) may be provided on the upper surface 10a of the substrate 10, so as to cover the resistor 30 and the wiring patterns 40, and to expose the electrodes 40A and the electronic component mounting area 101. By providing the cover layer 60A, it is possible to prevent mechanical damage and the like from occurring in the resistor 30 and the wiring patterns 40. Also, by providing the cover layer 60A, it is possible to protect the resistor 30 and the wiring patterns 40 from moisture and the like. Note that the cover layer 60A may be provided so as to cover the entire part excluding the electrodes 40A and the electronic component mounting area 101.

The cover layer 60A can be formed from an insulating resin; for example, PI resin, epoxy resin, PEEK resin, PEN resin, PET resin, PPS resin, composite resin (e.g., silicone resin, polyolefin resin), or the like. The cover layer 60A may contain a filler or a pigment. The thickness of the cover layer 60A is not limited in particular and can be selected appropriately depending on the purpose; for example, the thickness can be approximately 2 μm to 30 μm.

In order to manufacture a strain gauge 1, first, a substrate 10 is prepared, and a planar resistor 30 and a first layer 41 as illustrated in FIG. 1 are formed on the upper surface 10a of the substrate 10. The material and thickness of the resistor 30 and the first layer 41 are as described above. The resistor 30 and the first layer 41 can be integrally formed of the same material.

The resistor 30 and the first layer 41 can be formed by, for example, forming a film by a magnetron sputtering method using a material capable of forming the resistor 30 and the first layer 41 as a target, and patterning the film by photolithography. The resistor 30 and the first layer 41 may be formed using a reactive sputtering method, an evaporation method, an arc ion plating method, a pulse laser deposition method, or the like instead of the magnetron sputtering method.

From the viewpoint of stabilizing the gauge characteristics, before forming the resistor 30 and the first layer 41 as a film, as an underlayer, it is favorable to form in vacuum a functional layer as a film having a thickness of approximately 1 nm to 100 nm on the upper surface 10a of the substrate 10 by, for example, a conventional sputtering method. Note that after having the resistor 30 and the first layer 41 formed on the entire upper surface of the functional layer, the functional layer is patterned by photolithography together with the resistor 30 and the first layer 41 into a planar shape as illustrated in FIG. 1.

In the present application, the functional layer refers to a layer having a function of promoting crystal growth of at least the resistor 30 as the upper layer. It is favorable that the functional layer further has a function of preventing oxidation of the resistor 30 due to oxygen and moisture contained in the substrate 10, and a function of improving the adhesion between the substrate 10 and the resistor 30. The functional layer may further have other functions.

The insulating resin film constituting the substrate 10 contains oxygen and moisture, and thereby, especially when the resistor 30 contains Cr, Cr forms a self-oxidized film; therefore, it is effective that the functional layer has a function of preventing oxidation of the resistor 30.

The material of the functional layer is not limited in particular as long as it has a function of promoting crystal growth of at least the resistor 30 as the upper layer, and can be appropriately selected depending on the purpose; as the material, one or more species of metals selected from among a group consisting of, for example, Cr (chromium), Ti (titanium), V (vanadium), Nb (niobium), Ta (tantalum), Ni (nickel), Y (yttrium), Zr (zirconium), Hf (hafnium), Si (silicon), C (carbon), Zn (zinc), Cu (copper), Bi (bismuth), Fe (iron), Mo (molybdenum), W (tungsten), Ru (ruthenium), Rh (rhodium), Re (rhenium)), Os (osmium), Ir (iridium), Pt (platinum), Pd (palladium), Ag (silver), Au (gold), Co (cobalt), Mn (manganese), and Al (aluminum); an alloy of any of the metals in this group; or a compound of any of the metals in this group may be listed.

As examples of the alloys described above, FeCr, TiAl, FeNi, NiCr, CrCu, and the like may be listed. Also, as examples of the compounds described above, TiN, TaN, $Si_3N_4$, $TiO_2$, $Ta_2O_5$, $SiO_2$, and the like may be listed.

The functional layer can be formed by, for example, a conventional sputtering method using a material capable of forming the functional layer as a target, and introducing Ar (argon) gas into the chamber. By using the conventional sputtering method, the functional layer is formed as a film while the upper surface 10a of the substrate 10 is being etched with Ar; therefore, the effect of improving the adhesion can be obtained by minimizing the amount of the functional layer formed as a film.

However, this is an example of the method of forming a functional layer as a film, and the functional layer may be formed by another method. For example, a method may be used in which the upper surface 10a of the substrate 10 is activated by plasma treatment using Ar or the like before forming the functional layer so as to obtain an adhesion improving effect, and then, the functional layer is formed in vacuum as a film by a magnetron sputtering method.

The combination of the material of the functional layer and the material of the resistor 30 and the first layer 41 is not limited in particular and can be appropriately selected depending on the purpose; for example, it is possible to use Ti as the functional layer, and to form a Cr composite film containing α-Cr (alpha chromium) as the main component, as the resistor 30 and the first layer 41.

In this case, for example, the resistor 30 and the first layer 41 can be formed as a film by a magnetron sputtering method using a material capable of forming a Cr composite film as a target, and introducing Ar gas into the chamber. Alternatively, the resistor 30 and the first layer 41 may be formed as a film by a reactive sputtering method using pure Cr as a target, and introducing an appropriate amount of nitrogen gas together with Ar gas into the chamber.

In these methods, a growth face of the Cr mixed-phase film is defined and triggered by the functional layer formed of Ti, which enables to form a Cr composite film containing, as the main component, α-Cr having a stable crystal structure. Also, the gauge characteristics are improved by Ti constituting the functional layer diffusing into the Cr composite film. For example, the gauge factor of the strain gauge 1 can be greater than or equal to 10, and the temperature coefficient of gauge factor TCS and the temperature coefficient of resistance TCR can be fallen within a range of −1000 ppm/° C. to +1000 ppm/° C. Note that in the case where the functional layer is formed from Ti, the Cr composite film may contain Ti or TiN (titanium nitride).

Note that in the case where the resistor 30 is a Cr composite film, the functional layer made of Ti has all of the function of promoting the crystal growth of resistor 30; the function of preventing oxidation of the resistor 30 due to oxygen and moisture contained in the substrate 10; and the function of improving the adhesion between the substrate 10 and the resistor 30. The same applies in the case of using Ta, Si, Al, or Fe instead of Ti as the functional layer.

In this way, by providing a functional layer as the lower layer of the resistor 30, the crystal growth of the resistor 30 can be promoted, and the resistor 30 having a stable crystal phase can be manufactured. As a result, the stability of the gauge characteristics of the strain gauge 1 can be improved. Also, by diffusing the material constituting the functional layer into the resistor 30, the gauge characteristics of the strain gauge 1 can be improved.

After having the resistor 30 and the first layer 41 formed, a second layer 42 is layered on the first layer 41. The material and thickness of the second layer 42 are as described above. The second layer 42 can be formed by, for example, an electrolytic plating method or an electroless plating method.

After having the second layer 42 formed, if necessary, by providing a cover layer 60A on the upper surface 10a of the substrate 10, so as to cover the resistor 30 and the wiring patterns 40, and to expose the electrodes 40A and the electronic component mounting area 101, the strain gauge 1 is completed. The cover layer 60A can be manufactured, for example, by laminating a thermosetting insulating resin film in a semi-cured state on the upper surface 10a of the substrate 10, so as to cover the resistor 30 and the wiring patterns 40, and to expose the electrodes 40A and the electronic component mounting area 101, and heating the laminated film to be cured. The cover layer 60A may also be manufactured by applying a liquid or paste-like thermosetting insulating resin to the upper surface 10a of the substrate 10, so as to cover the resistor 30 and the wiring patterns 40, and to expose the electrodes 40A and the electronic component mounting area 101, and heating the resin to be cured.

Figure 3:
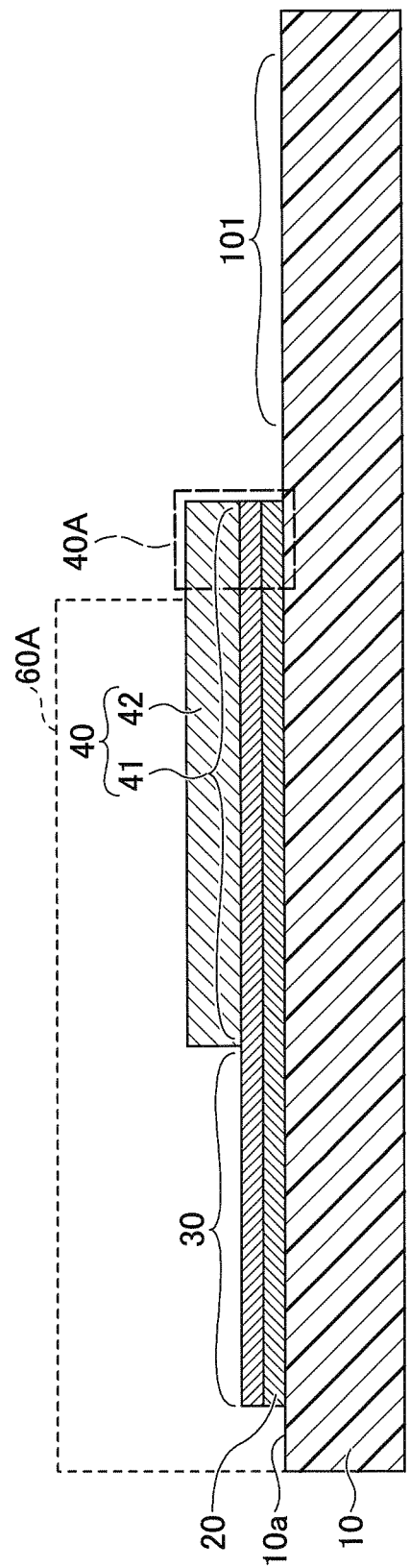
FIG. 3 is a second cross-sectional view illustrating a strain gauge according to the first embodiment.

Note that in the case of providing the functional layer on the upper surface 10a of the substrate 10 as the underlayer of the resistor 30 and terminal parts 41, the strain gauge 1 has a cross-sectional shape illustrated in FIG. 3. A layer indicated by a reference numeral 20 is the functional layer. The planar shape of the strain gauge 1 in the case of providing the functional layer 20 is the same as that in FIG. 1.

In this way, in the strain gauge 1, the resistor 30, the wiring patterns 40, the electrodes 40A, and the electronic component mounting area 101 are provided on the upper surface 10a of one substrate 10. This enables an electronic component mounted on the electronic component mounting area 101 and the electrodes 40A, to be connected within a short distance by metal wires and the like; therefore, the distance from the resistor 30 to the electronic component can be shortened, and the strain gauge 1 can be implemented to have a small size. This structure is particularly effective for a small strain gauge in which it is difficult to connect the resistor and the electronic component with each other using lead wires by soldering or the like.

Also, by shortening the distance from the resistor 30 to the electronic component, the noise resistance can be improved.

Also, the electrodes 40A have a structure in which the second layer 42 is layered on the first layer 41. Therefore, by selecting the material of the second layer 42, it is possible to improve the connection reliability with an electronic component without depending on the material of the first layer 41 which is the same material as the resistor 30.

Modified Example 1 of the First Embodiment

In a modified example 1 of the first embodiment, an example of a strain gauge will be described in which electronic components are mounted on an electronic component mounting area. Note that in the modified example 1 of the first embodiment, description of the same components as those already described may be omitted.

Figure 4:
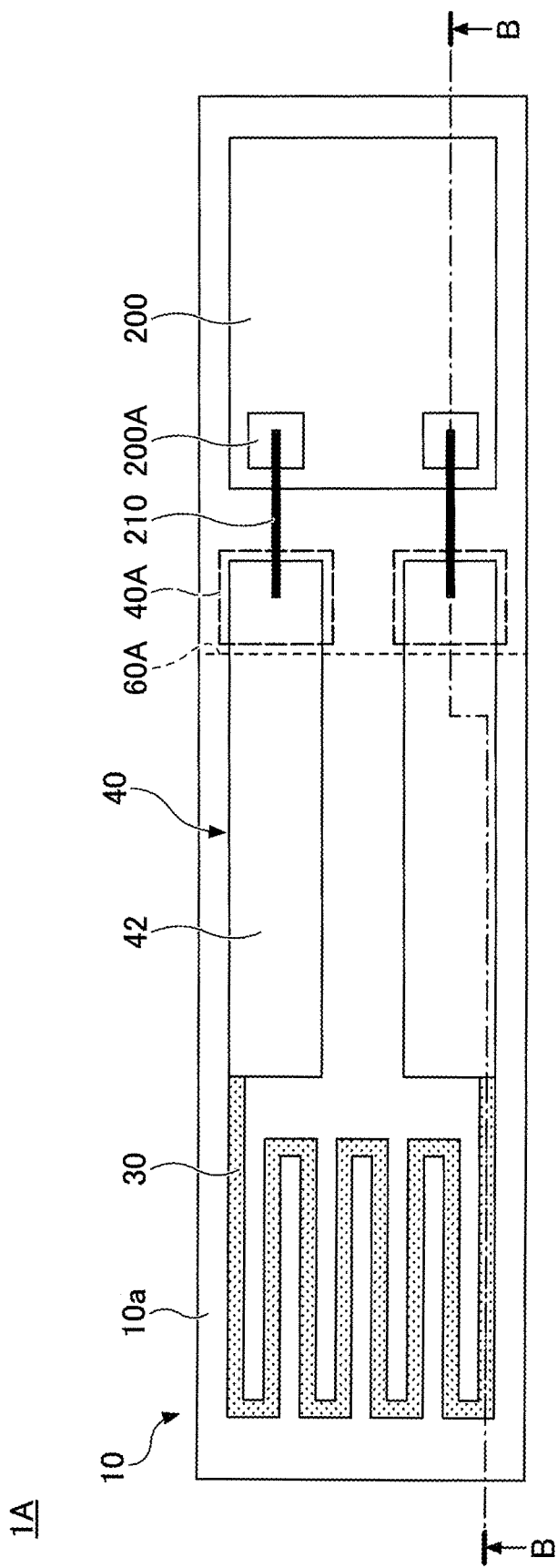
FIG. 4 is a plan view illustrating a strain gauge according to a modified example 1 of the first embodiment.
Figure 5:
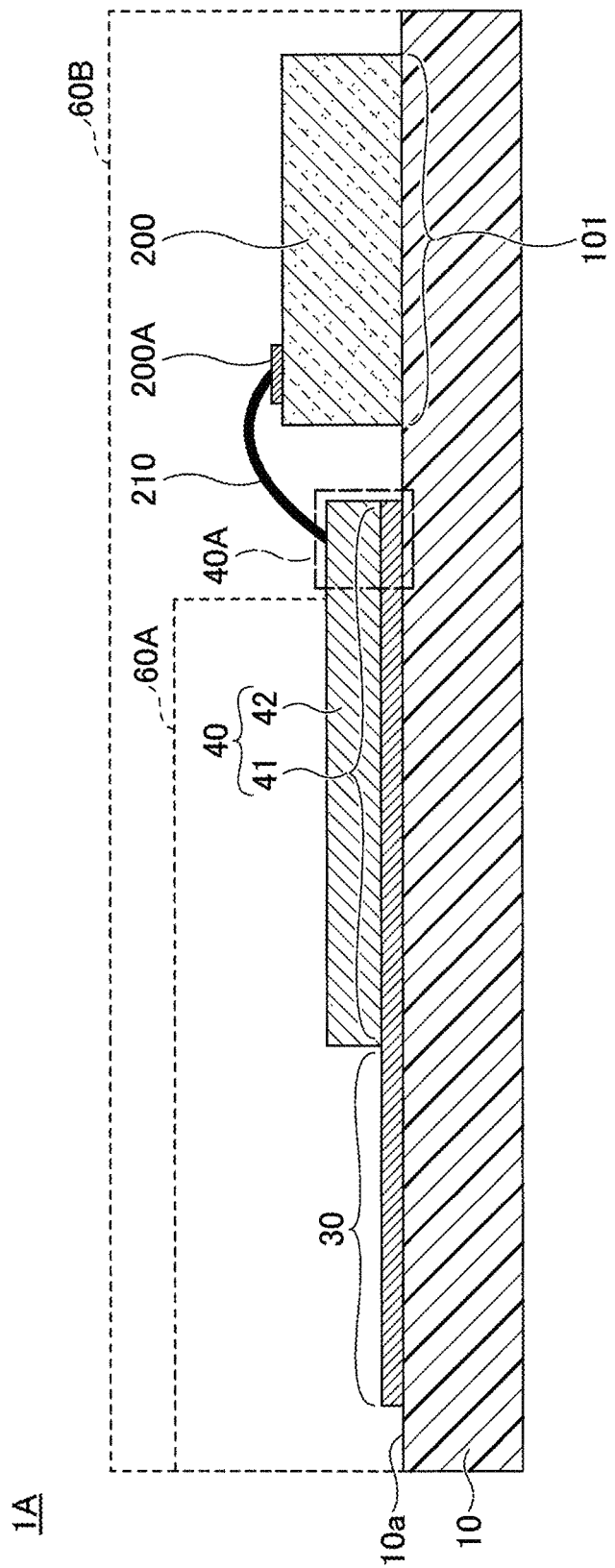
FIG. 5 is a cross-sectional view illustrating a strain gauge according to the modified example 1 of the first embodiment.

FIG. 4 is a plan view illustrating a strain gauge according to a modified example 1 of the first embodiment. FIG. 5 is a cross-sectional view illustrating the strain gauge according to the modified example 1 of the first embodiment, which illustrates a cross section along a line BB in FIG. 4.

Referring to FIGS. 4 and 5, the strain gauge 1A has an electronic component 200 mounted on the electronic component mounting area 101 of the strain gauge 1.

The electronic component 200 is, for example, a semiconductor chip that performs amplification of an electric signal input from the resistor 30 via the wiring patterns 40 and the electrodes 40A, and temperature correction. A passive component such as a capacitor may be mounted together with the semiconductor chip. The electronic component 200 is mounted on the electronic component mounting area 101 demarcated on the upper surface 10a of the substrate 10, via an adhesive layer such as a die attach film.

Each electrode 200A of the electronic component 200 is electrically connected to a corresponding electrode 40A via a metal wire 210 such as a gold wire or a copper wire. The electrodes 200A and the electrodes 40A can be connected by, for example, wire bonding.

In the case where a cover layer 60A is not provided on the upper surface 10a of the substrate 10, a cover layer 60B (a second insulating resin layer) may be provided on the upper surface 10a of the substrate 10, so as to cover the resistor 30, the wiring patterns 40, the electrodes 40A, the electronic component 200, and the metal wires 210. By providing the cover layer 60B, it is possible to prevent mechanical damage and the like from occurring in the resistor 30, the wiring patterns 40, the electrodes 40A, the electronic component 200, and the metal wires 210. Also, by providing the cover layer 60B, it is possible to protect the resistor 30, the wiring patterns 40, the electrodes 40A, the electronic component 200, and the metal wires 210 from moisture and the like.

The cover layer 60B can be formed from an insulating resin; for example, PI resin, epoxy resin, PEEK resin, PEN resin, PET resin, PPS resin, composite resin (e.g., silicone resin, polyolefin resin), or the like. The cover layer 60B may contain a filler or a pigment. The thickness of the cover layer 60B is not limited in particular and can be selected appropriately depending on the purpose; for example, the thickness can be approximately 2 µm to 30 µm. The cover layer 60B can be manufactured, for example, by laminating a thermosetting insulating resin film in a semi-cured state on the upper surface 10a of the substrate 10, so as to cover the wiring patterns 40, the electrodes 40A, the electronic component 200, and the metal wires 210, and heating the laminated film to be cured. The cover layer 60B may also be manufactured by applying a liquid or paste-like thermosetting insulating resin to the upper surface 10a of the substrate 10, so as to cover the wiring patterns 40, the electrodes 40A, the electronic component 200, and the metal wires 210, and heating the resin to be cured.

In the case where a cover layer 60A is provided on the upper surface 10a of the substrate 10, a cover layer 60B may be further provided so as to cover the cover layer 60A, the electrodes 40A, the electronic component 200, and the metal wires 210. By providing the cover layer 60B, it is possible to prevent mechanical damage and the like from occurring in the electrodes 40A, the electronic component 200, and the metal wires 210 that are not covered by the cover layer 60A. Also, by providing the cover layer 60B, it is possible to protect the electrodes 40A, the electronic component 200, and the metal wires 210 from moisture and the like that are not covered by the cover layer 60A. Note that the cover layer 60A and the cover layer 60B may be formed from the same material, or may be formed from different materials.

In this way, in the strain gauge 1A, the resistor 30, the wiring patterns 40, the electrodes 40A, and the electronic component 200 are provided on the upper surface 10a of one substrate 10. The electrodes 200A of the electronic component 200 and the electrodes 40A can be connected within a short distance by the metal wires 210; therefore, the distance from the resistor 30 to the electronic component 200 can be shortened, and the strain gauge 1A can be implemented to have a small size. This structure is particularly effective for a small strain gauge in which it is difficult to connect the resistor and the electronic component with each other using lead wires by soldering or the like.

Also, by shortening the distance from the resistor 30 to the electronic component 200, the noise resistance can be improved.

Also, the electrodes 40A have a structure in which the second layer 42 is layered on the first layer 41. Therefore, by selecting the material of the second layer 42, it is possible to improve the connection reliability with the electronic component 200 without depending on the material of the first layer 41 which is the same material as the resistor 30.

Note that in FIGS. 4 and 5, although an example has been described in which the electrodes 40A and the electrodes 200A are connected by the metal wires 210, the electronic component 200 may be flip-chip mounted on the upper surface 10a of the substrate 10. In this case, the layout of the wiring patterns 40 is changed so that the electrodes 40A are arranged within the electronic component mounting area 101, and the electrodes 40A and the electrodes 200A of the electronic component 200 in the electronic component mounting area 101 can be connected to each other by using solder balls or the like.

Modified Example 2 of the First Embodiment

In a modified example 2 of the first embodiment, an example of a strain gauge will be described that is provided with multiple resistors and the like. Note that in the modified example 2 of the first embodiment, description of the same components as those already described may be omitted.

Figure 6:
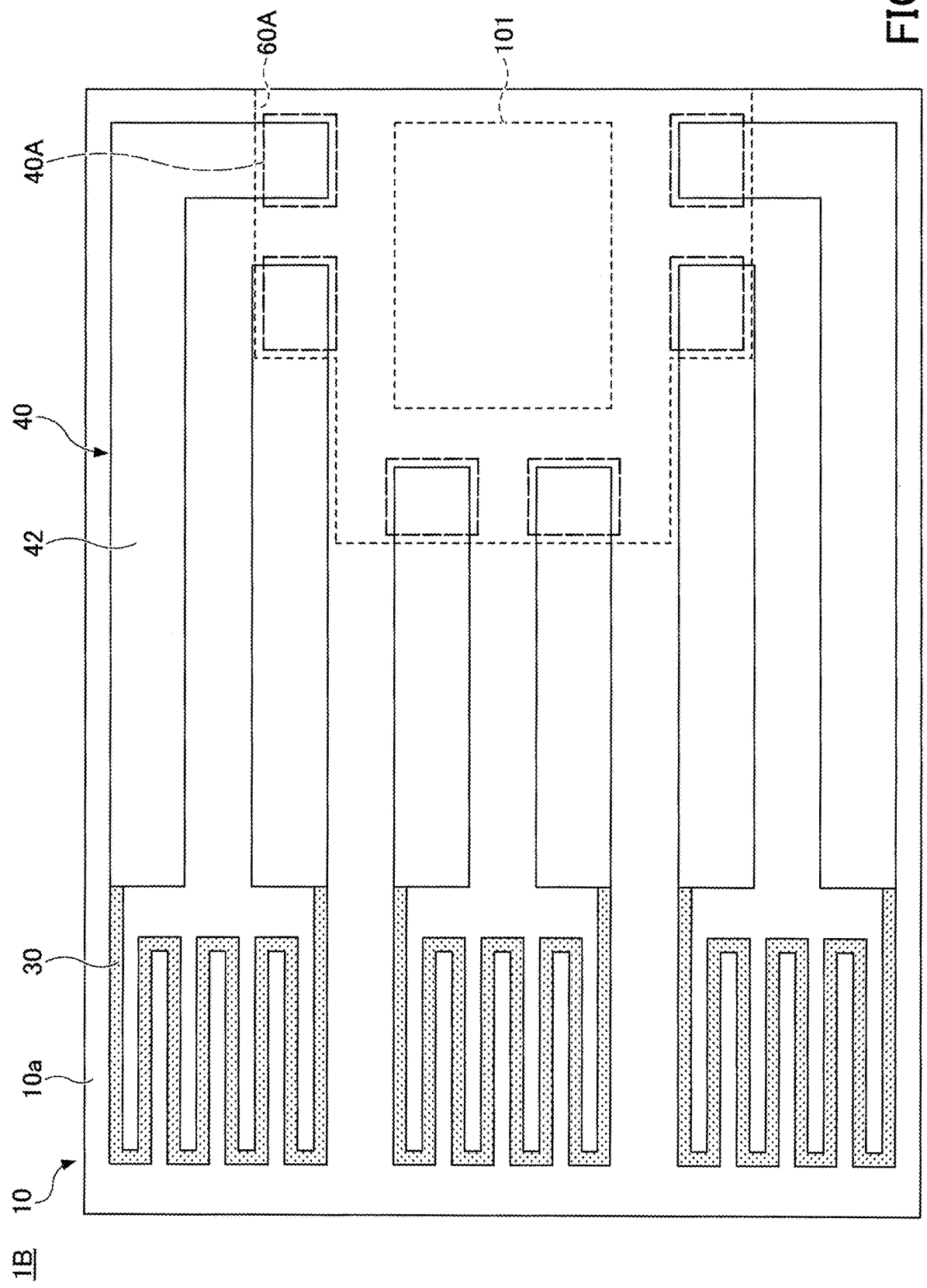
FIG. 6 is a first plan view illustrating a strain gauge according to a modified example 2 of the first embodiment.

FIG. 6 is a plan view illustrating a strain gauge according to a modified example 2 of the first embodiment. The cross-sectional structure of the strain gauge according to the modified example 2 of the first embodiment is the same as that in FIG. 2, and hence, illustration of the cross-sectional view is omitted.

Referring to FIG. 6, a strain gauge 1B has multiple sets of resistors 30, wiring patterns 40, and electrodes 40A, and in this regard, differs from the strain gauge 1 (see FIGS. 1 and 2). In the example in FIG. 6, the strain gauge 1B has three sets of resistors 30, wiring patterns 40, and electrodes 40A, but is not limited as such; the strain gauge according to the present example may have two sets of resistors 30, wiring patterns 40, and electrodes 40A, or may have four sets or more. Also, the number of resistors 30 and the number of electrodes 40A do not need to be the same.

Figure 7:
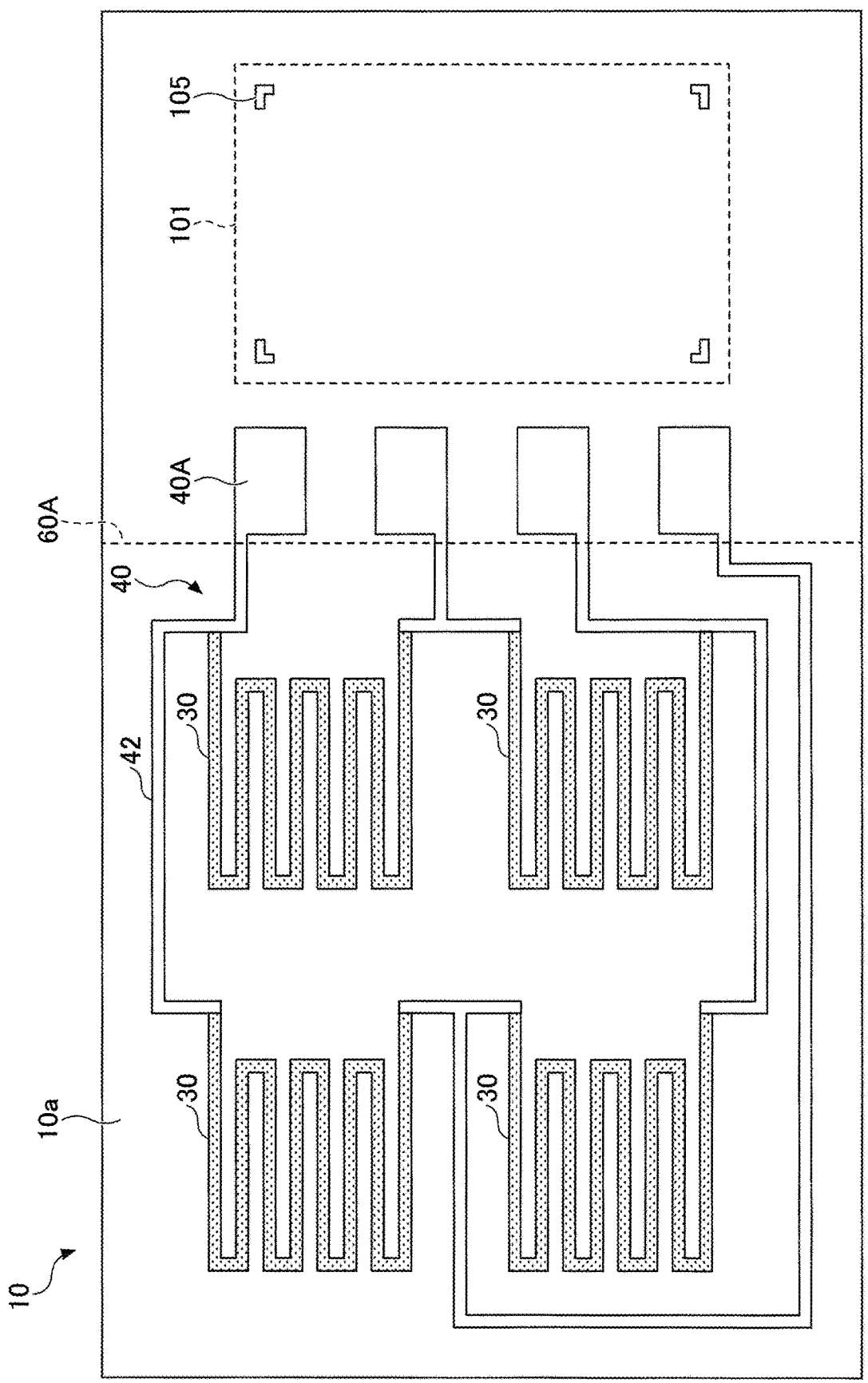
FIG. 7 is a second plan view illustrating a strain gauge according to a modified example 2 of the first embodiment.

For example, like a strain gauge 1C illustrated in FIG. 7, four resistors 30 may be connected by wiring patterns 40 to form a Wheatstone bridge circuit. In this case, four connection points of any two resistors 30 are connected to the electrodes 40A via the wiring patterns 40, respectively. Note that the grid direction of each resistor 30 in FIG. 7 is an example, and is not limited as such.

Also, in FIG. 7, position determination marks 105 are formed near four corners in the electronic component mounting area 101. The position determination marks 105 are marks used for determining a position when mounting an electronic component on the electronic component mounting area 101. By forming the position determination marks 105, the mounting position of an electronic component becomes clear, and by controlling the position by a chip mounter or the like, it is possible to precisely mount the electronic component on the electronic component mounting area 101 at the position. The position determination marks 105 can be formed, for example, in the same process with the resistors 30, the wiring patterns 40, and the electrodes 40A. However, the position determination marks 105 may be formed as needed, and the formation of the position determination marks 105 is not mandatory.

In FIGS. 6 and 7, a cover layer 60A may be provided on the upper surface 10a of the substrate 10, so as to cover the resistors 30 and the wiring patterns 40, and to expose the electrodes 40A and the electronic component mounting area 101. The material, thickness, and manufacturing method of the cover layer 60A are as described above.

In this way, in the strain gauge 1 or 1C, multiple sets of the resistors 30, the wiring patterns 40, and the electrodes 40A; and the electronic component mounting area 101 are provided on the upper surface 10a of one substrate 10. This enables to implement the strain gauge 1B or 1C that has a small size, and is capable of detecting strains in multiple areas. The other effects are substantially the same as in the first embodiment.

Modified Example 3 of the First Embodiment

In a modified example 3 of the first embodiment, an example of a strain gauge will be described in which multiple sets of resistors and the like are provided, and an electronic component is mounted on an electronic component mounting area. Note that in the modified example 3 of the first embodiment, description of the same components as those already described may be omitted.

Figure 8:
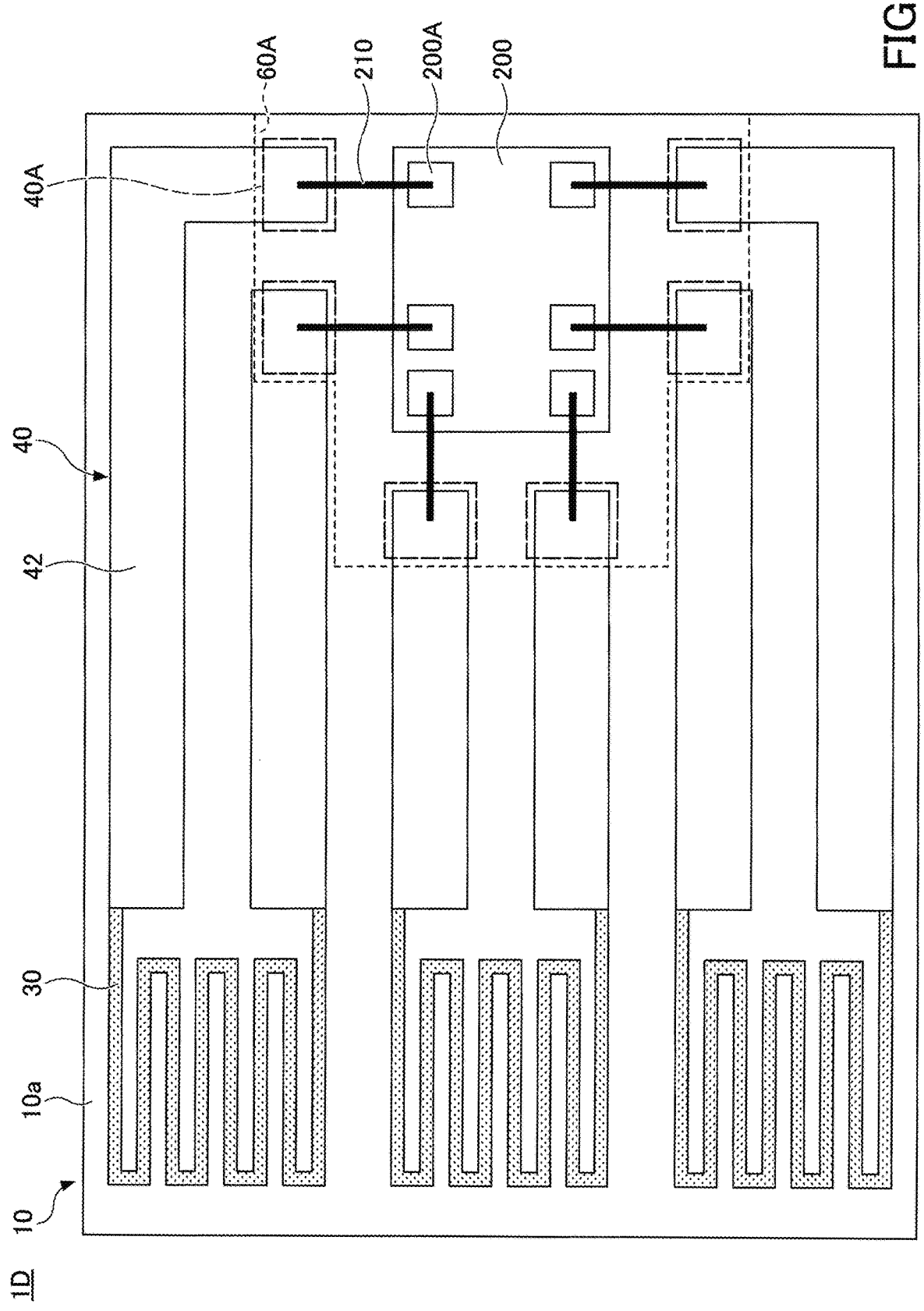
FIG. 8 is a plan view illustrating a strain gauge according to a modified example 3 of the first embodiment.

FIG. 8 is a plan view illustrating a strain gauge according to the modified example 3 of the first embodiment. The cross-sectional structure of the strain gauge according to the modified example 3 of the first embodiment is the same as that in FIG. 5, and hence, illustration of the cross-sectional view is omitted.

Referring to FIG. 8, a strain gauge 1D has an electronic component 200 mounted on the electronic component mounting area 101 of the strain gauge 1B.

The electronic component 200 is, for example, a semiconductor chip that performs amplification of an electric signal input from the resistor 30 via the wiring patterns 40 and the electrodes 40A; and temperature correction, and has a function of independently processing electric signals input from the multiple resistors 30. A passive component such as a capacitor may be mounted together with the semiconductor chip. The electronic component 200 is mounted on the electronic component mounting area 101 demarcated on the upper surface 10a of the substrate 10, via an adhesive layer such as a die attach film.

Each electrode 200A of the electronic component 200 is electrically connected to an electrode 40A of a corresponding set via a metal wire 210 such as a gold wire or a copper wire. The electrodes 200A and the electrodes 40A can be connected by, for example, wire bonding.

However, electronic components may be individually mounted for the respective sets of the resistors 30, the wiring patterns 40, and the electrodes 40A.

In FIG. 8, a cover layer 60A may be provided on the upper surface 10a of the substrate 10, so as to cover the resistor 30 and the wiring patterns 40, and to expose the electrodes 40A and the electronic component mounting area 101. Also, a cover layer 60B may be provided on the upper surface 10a of the substrate 10, so as to cover the resistor 30, the wiring patterns 40, the electrodes 40A, the electronic component 200, and the metal wires 210. Also, a cover layer 60A may be provided on the upper surface 10a of the substrate 10, so as to cover the resistor 30 and the wiring patterns 40, and to expose the electrodes 40A and the electronic component mounting area 101; and a cover layer 60B may be further provided so as to cover the cover layer 60A, the electrodes 40A, the electronic component 200, and the metal wires 210. The material, thickness, and manufacturing method of the cover layers 60A and 60B are as described above.

Also, instead of a strain gauge 1B, a strain gauge 1C may be used.

In this way, in the strain gauge 1D, multiple sets of the resistor 30, the wiring patterns 40, and the electrodes 40A; and the electronic component 200 are provided on the upper surface 10a of one substrate 10. The electrodes 200A of the electronic component 200 and the electrodes 40A of each set can be connected within a short distance by the metal wire 210; therefore, the distance from the resistor 30 of each set to the electronic component 200 can be shortened, and the strain gauge 1D can be implemented to have a small size, and is capable of detecting strains in multiple areas. The other effects are substantially the same as in the modified example 1 of the first embodiment.

Note that in FIG. 8, although an example has been described in which the electrodes 40A of each set and the electrodes 200A are connected by the metal wires 210, the electronic component 200 may be flip-chip mounted on the upper surface 10a of the substrate 10. In this case, the layout of the wiring patterns 40 in each set is changed so that the electrodes 40A in the set are arranged within the electronic component mounting area 101, and the electrodes 40A of the set and the electrodes 200A of the electronic component 200 in the electronic component mounting area 101 can be connected to each other by using solder balls or the like.

Second Embodiment

In the second embodiment, an example of a sensor module using a strain gauge will be described. Note that in the second embodiment, description of the same components as those already described may be omitted.

FIG. 9 is a cross-sectional view illustrating a sensor module according to the second embodiment, which illustrates a cross section corresponding to FIG. 5. Referring to FIG. 9, a sensor module 5 includes a strain gauge 1A, a strain generator 510, and an adhesive layer 520.

In the sensor module 5, an upper surface 510a of the strain generator 510 is fixed to a lower surface 10b of the substrate 10 via the adhesive layer 520. The strain generator 510 is, for example, an object formed from a metal such as Fe, SUS (stainless steel), or Al; or a resin such as PEEK, and deforms (generates a strain) in response to an applied force. The strain gauge 1A can detect a strain generated in the strain generator 510 as a change in the resistance value of the resistor 30.

The material of the adhesive layer 520 is not limited in particular, and can be appropriately selected depending on the purpose as long as having a function of adhering the strain gauge 1A with the strain generator 510; for example, an epoxy resin, modified epoxy resin, silicone resin, modified silicone resin, urethane resin, modified urethane resin, or the like can be used. Also, a material such as a bonding sheet may be used. The thickness of the adhesive layer 520 is not limited in particular and can be selected appropriately depending on the purpose; for example, the thickness can be approximately 0.1 μm to 50 μm.

In order to manufacture a sensor module 5, after having a strain gauge 1A manufactured, for example, any one of the materials described above serving as the adhesive layer 520 is applied to the lower surface 10b of the substrate 10 and/or the upper surface 510a of the strain generator 510. Then, the lower surface 10b of the substrate 10 is faced to the upper surface 510a of the strain generator 510, and the strain gauge 1A is arranged on the strain generator 510 having the applied material interposed in-between. Alternatively, a bonding sheet may be sandwiched between the strain generator 510 and the substrate 10.

Next, the strain gauge 1A is heated up to a predetermined temperature while being pressed against the strain generator 510, and the applied material is cured to form the adhesive layer 520. This makes the upper surface 510a of the strain generator 510 adhered with the lower surface 10b of the substrate 10 via the adhesive layer 520, and the sensor module 5 is completed. The sensor module 5 can be applied to, for example, measurement of load, pressure, torque, acceleration, and the like.

Note that in the sensor module 5, a strain gauge 1, 1B, 1C, or 1 may be used instead of the strain gauge 1A. However, in the case of using the strain gauge 1, 1B, or 1C, although the cover layer 60A may be provided as necessary, the cover layer 60B is not provided.

As above, the preferred embodiments and the like have been described in detail; note that the present invention is not limited to the embodiments described above and the like, and various modifications and substitutions can be made to the embodiments and the like described above without departing from the scope described in the claims.

The present international application claims priority based on Japanese Patent Application No. 2017-208195 filed on Oct. 27, 2017, and the entire contents of Japanese Patent Application No. 2017-208195 are incorporated herein by reference.

DESCRIPTION OF REFERENCE CODES 1, 1A, 1B, 1C, 1D strain gauge
5 sensor module
10 substrate
10a, 510a upper surface
10b lower surface
20 functional layer
30 resistor
40 wiring pattern
40A, 200A electrode
41 first layer
42 second layer
60A, 60B cover layer
101 electronic component mounting area
105 position determination mark
200 electronic component
210 metal wire
510 strain generator
520 adhesive layer

The invention claimed is:

1. A strain gauge comprising:
a substrate formed of resin and having flexibility;
a functional layer formed from a metal, an alloy, or a metal compound, the functional layer being situated directly on one surface of the substrate;
a resistor formed from a material containing at least one of chromium and nickel, the resistor being situated on one surface of the functional layer;

a pair of line patterns formed on the one surface of the functional layer and electrically connected to both ends of the resistor; and a pair of electrodes formed on the one surface of the functional layer, electrodes in the pair of electrodes being electrically connected to line patterns in the pair of line patterns, respectively, wherein the line patterns include
a first layer extending from the resistor, and
a second layer having a lower resistance than the first layer and layered on the first layer, wherein on the substrate, an electronic component mounting area is demarcated, on which an electronic component electrically connected to the electrodes is mounted, and wherein the functional layer is patterned into a same planar shape as the resister.

2. A strain gauge comprising:
a substrate formed of resin and having flexibility;
a functional layer formed from a metal, an alloy, or a metal compound, directly on one surface of the substrate;
a resistor formed as a film that contains Cr, CrN, and $Cr_2N$ and into which an element contained in the functional layer is diffused, the resistor being situated on one surface of the functional layer;
a pair of line patterns formed on the one surface of the functional layer and electrically connected to both ends of the resistor; and
a pair of electrodes formed on the one surface of the functional layer and electrically connected to the pair of line patterns, respectively,
wherein a gauge factor of the strain gauge is greater than or equal to 10,
wherein the line patterns include
a first layer extending from the resistor, and
a second layer having a lower resistance than the first layer and layered on the first layer,
wherein on the substrate, an electronic component mounting area is demarcated, on which an electronic component electrically connected to the electrodes is mounted, and
wherein the functional layer is patterned into a same planar shape as the resister.

3. A strain gauge comprising:
a substrate formed of resin and having flexibility;
a functional layer formed from a metal, an alloy, or a metal compound, directly on one surface of the substrate;
a resistor formed as a film containing Cr, CrN, and $Cr_2N$ on one surface of the functional layer;
a pair of line patterns formed on the one surface of the functional layer and electrically connected to both ends of the resistor; and a pair of electrodes formed on the one surface of the functional layer and electrically connected to the pair of line patterns, respectively, wherein the line patterns include
a first layer extending from the resistor, and
a second layer having a lower resistance than the first layer and layered on the first layer, wherein on the substrate, an electronic component mounting area is demarcated, on which an electronic component electrically connected to the electrodes is mounted, and wherein the functional layer is patterned into a same planar shape as the resister.

4. The strain gauge as claimed in claim 2 wherein the functional layer contains one or more species of metals selected from among a group consisting of Cr, Ti, V, Nb, Ta, Ni, Y, Zr, Hf, Si, C, Zn, Cu, Bi, Fe, Mo, W, Ru, Rh, Re, Os, Ir, Pt, Pd, Ag, Au, Co, Mn, and Al; an alloy of any of the metals in the group; or a compound of any of the metals in the group.

5. The strain gauge as claimed in claim 2, wherein the functional layer contains one or more species of metals selected from among a group consisting of Cr, V, Nb, Ta, Ni, Y, Hf, C, Zn, Bi, Fe, Mo, W, Ru, Rh, Re, Os, Ir, Pt, Pd, Ag, Au, Co, and Mn; an alloy of any of the metals in the group; or a compound of any of the metals in the group.

6. The strain gauge as claimed in claim 4, wherein the functional layer further contains one species of metal compound selected from among a group consisting of TiN, TaN, $Si_3N_4$, $TiO_2$, $Ta_2O_5$, and $SiO_2$.

7. The strain gauge as claimed in claim 6, wherein the functional layer further contains one species of metal compound selected from among a group consisting of TiN, TaN, $Si_3N_4$, and $Ta_2O_5$.

8. The strain gauge as claimed in claim 4, wherein the functional layer further contains one species of alloy selected from among a group consisting of FeCr, TiAl, FeNi, NiCr, and CrCu.

9. The strain gauge as claimed in claim 2, wherein the functional layer has a function of preventing oxidation of the resistor; a function of controlling movement of oxygen and water contained the substrate toward the resister; and a function of improving adhesion between the substrate and the resistor.

10. The strain gauge as claimed in claim 2, wherein a thickness of the functional layer is 1 nm to 100 nm.

11. A sensor module comprising:
the strain gauge as claimed in claim 1; and
a strain generator provided on another surface side of the substrate.

* * * * *